United States Patent
Hernando et al.

(10) Patent No.: US 8,854,038 B2
(45) Date of Patent: Oct. 7, 2014

(54) **METHOD FOR $R_2^*$ QUANTIFICATION WITH MAGNETIC RESONANCE IMAGING**

(75) Inventors: Diego Hernando, Madison, WI (US); Scott Brian Reeder, Middleton, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 510 days.

(21) Appl. No.: 13/089,653

(22) Filed: Apr. 19, 2011

(65) Prior Publication Data

US 2012/0268121 A1    Oct. 25, 2012

(51) Int. Cl.
*G01R 33/48*    (2006.01)
*G01R 33/50*    (2006.01)
*G01R 33/565*   (2006.01)

(52) U.S. Cl.
CPC .......... *G01R 33/50* (2013.01); *G01R 33/56563* (2013.01); *G01R 33/4828* (2013.01); *G01R 33/56536* (2013.01)
USPC .......................................... 324/309; 324/307

(58) Field of Classification Search
CPC ............................ G01R 33/50; G01R 33/5601
USPC ............ 324/300–322; 382/131; 600/410–412
See application file for complete search history.

(56) References Cited

U.S. PATENT DOCUMENTS

| 7,924,003 | B2 | 4/2011 | Yu et al. | |
| 2009/0261823 | A1* | 10/2009 | Yu et al. | 324/307 |

OTHER PUBLICATIONS

Baharlou, Simin, "International Preliminary Report on Patentability" EPO, all pages.*
Hernando, Diego et al. "Estimation of water/fat images, B0 field map and T2* map using VARPRO" PISMRM, 15th Annual Meeting and Exhibition, Totonto, Canada, May 3-9, 2008, vol. 15, Apr. 19, 2008, p. 1517.*
Hernando, Diego et al. "Joint estimation of water/fat images and field inhomogeneity map" MRM, vol. 59, No. 3, Mar. 1, 2008, pp. 571-580.*
An, et al., Cerebral Oxygen Extraction Fraction and Cerebral Venous Blood Volume Measurements Using MRI: Effects of Magnetic Field Variation, Magn. Reson. Med., 2002, 47:958-966.
Baudrexel, et al., Rapid Single-Scan T*2 Mapping Using Exponential Excitation Pulses and Image-Based Correction for Linear Background Gradients, Magn. Reson. Med., 2009, 62:263-268.

(Continued)

*Primary Examiner* — Melissa Koval
*Assistant Examiner* — Rishi Patel
(74) *Attorney, Agent, or Firm* — Quarles & Brady, LLP (57) ABSTRACT

A method for measuring transverse relaxation rate, $R_2^*$, corrected for the presence of macroscopic magnetic field inhomogeneities with a magnetic resonance imaging (MRI) system is provided. The method accounts for additional signal decay that occurs as a result of macroscopic variations in the main magnetic field, $B_0$, of the MRI system, and also mitigates susceptibility-based errors and introduction of increased noise in the $R_2^*$ measurements. Image data are acquired by sampling multiple different echo signals occurring at respectively different echo times. A $B_0$ field inhomogeneity map is estimated by fitting the acquired image data to an initial signal model. Using the estimated field map, a revised signal model that accounts for signal from multiple different chemical species and for signal decay resulting from macroscopic variations in the $B_0$ field is formed. Corrected $R_2^*$ values for the different chemical species are then estimated by fitting the acquired image data to the revised signal model.

14 Claims, 3 Drawing Sheets

(56) References Cited

OTHER PUBLICATIONS

Bydder, et al., MR Imaging of the Liver Using Short T1 Inversion Recovery Sequences, J. Comput. Assist. Tomogr., 1985, 9:1084-1089.

Cho, et al., Reduction of Susceptibility Artifact in Gradient-Echo Imaging, Magn. Reson. Med., 1992, 23:193-200.

Dahnke, et al., Limits of Detection of SPIO at 3.0 T Using $T*2$ Relaxometry, Magn. Reson. Med., 2005, 53:1202-1206.

Dixon, Simple Proton Spectroscopic Imaging, Radiology, 1984, 153:189-194.

Fernandez-Seara, et al., Postprocessing Technique to Correct for Background Gradients in Image-Based $R*2$ Measurements, Magn. Reson. Med., 2000, 44:358-366.

Frahm, et al., Direct Flash MR Imaging of Magnetic Field Inhomogeneities by Gradient Compensation, Magn. Reson. Med., 1988, 6:474-480.

Haacke, et al., Reduction of T2* Dephasing in Gradient Field-Echo Imaging, Radiology, 1989, 170:457-462.

Haase, et al., 1H NMR Chemical Shift Selective (CHESS) Imaging, Phys. Med., Biol., 1985, 30(4):341-344.

Ma, Dixon Techniques for Water and Fat Imaging, J. Magn. Reson. Imaging, 2008, 28:543-558.

Meyer, et al., Simultaneous Spatial and Spectral Selective Excitation, Magn. Reson. Med., 1990, 15:287-304.

Ordidge, et al., Assessment of Relative Brain Iron Concentrations Using T2-Weighted and T2*—Weighted MRI at 3 Tesla, Magn. Reson. Med., 1994, 32:335-341.

Reeder, et al., Multicoil Dixon Chemical Species Separation with an Iterative Least Squares Estimation Method, Magn. Reson. Med., 2004, 51:35-45.

Reeder, et al., Cardiac Cine Imaging with IDEAL Water-Fat Separation and Steady-State Free Precession, J. Magn. Reson. Imaging, 2005, 22:44-52.

Truong, et al., Blipped Multi Gradient Echo Slice Excitation Profile Imaging (bmGESEPI) for Fast T2* Measurements with Macroscopic B0 Inhomogeneity Compensation, Magn. Reson. Med., 2006, 55:1390-1395.

Volz, et al., Reduction of Susceptibility-Induced Signal Losses in Multi-Gradient-Echo Images: Application to Improved Visualization of the Subthalamic Nucleus, Neuroimage, 2009, 45:1135-1143.

Wild, et al., Multiple Gradient Echo Sequence Optimized for Rapid, Single-Scan Mapping of $R2*$ at High B0, Magn. Reson. Med., 2002, 48:867-876.

Yang, et al. Multi-Gradient Echo with Susceptibility Inhomogeneity Compensation (MGESIC): Demonstration of fMRI in the Olfactory Cortex at 3.0 T., Magn. Reson. Med., 1997, 37:331-335.

Yang, et al., Removal of Local Field Gradient Artifacts in T2*—Weighted Images at High Fields by Gradient-Echo Slice Excitation Profile Imaging, Magn. Reson. Med., 1998, 39:402-409.

Yang, et al., Reduction of Magnetic Field Inhomogeneity Artifacts in Echo Planar Imaging with SENSE and GESEPI at High Field, Magn. Reson. Med., 2004, 52:1418-1423.

Yang, et al., Postprocessing Correction for Distortions in $T*2$ Decay Caused by Quadratic Cross-Slice B0 Inhomogeneity, Magn. Reson. Med., 2010, 63:1258-1268.

Yu, et al., Multiecho Water-Fat Separation and Simultaneous R2* Estimation with Multifrequency Fact Spectrum Modeling, Magn. Reson. Med., 2008, 60:1122-1134.

* cited by examiner

METHOD FOR $R_2^*$ QUANTIFICATION WITH MAGNETIC RESONANCE IMAGING

STATEMENT REGARDING FEDERALLY SPONSORED RESEARCH

This invention was made with government support under DK083380 awarded by the National Institutes of Health. The government has certain rights in the invention.

BACKGROUND OF THE INVENTION

The field of the invention is systems and methods for magnetic resonance imaging ("MRI"). More particularly, the invention relates to systems and methods for separating signal contributions from two or more chemical species using MRI.

Mapping of effective transverse relaxation rate, $R_2^*$, relaxivity has important applications in MRI, including blood oxygenation level dependent ("BOLD") functional imaging; detection and tracking of superparamagnetic iron oxides ("SPIOs"); and assessment of iron content in brain, heart, pancreas, and liver. $R_2^*$ maps can be obtained from relatively rapid data acquisitions, such as gradient echo, or spoiled gradient ("SPGR") based multi-echo imaging, which is advantageous for body imaging applications where motion is an issue.

Measurements of $R_2^*$ are affected by several confounding factors. For example, the presence of fat, such as triglycerides, in the tissue under examination introduces additional modulation in the acquired signal, and can lead to severe bias in $R_2^*$ measurements. Furthermore, the presence of macroscopic $B_0$ field variations introduces additional intravoxel dephasing in the acquired signal, which can lead to severe overestimation of $R_2^*$, particularly in regions with rapid $B_0$ gradients, such as near tissue-air interfaces, or other areas with locally sharp changes in magnetic susceptibility. These confounding factors generally make $R_2^*$ maps dependent on the data acquisition parameters. For instance, in the presence of fat, apparent $R_2^*$ maps estimated without accounting for fat will heavily depend on the choice of echo times. In the presence of macroscopic field variations, the apparent $R_2^*$ maps will also depend on the spatial resolution, particularly the largest dimension, which is usually the slice thickness.

Errors arising from the presence of fat are typically addressed by acquiring in-phase echoes. This approach largely addresses the effects of fat, although it does have several drawbacks. First, not all fat peaks are in phase with the water peak, just the main methylene peak; and second, the technique forces relatively large echo spacings, which may not be optimal for measuring large $R_2^*$ values, such as in the presence of iron overload. Alternative techniques, such as spectrally selective fat suppression, or those that use spatial-spectral pulses, are sensitive to $B_0$ field inhomogeneities that can be important in many applications, such as liver or heart imaging. Other techniques, such as short-tau inversion recovery ("STIR") fat nulling, are effective and can be made insensitive to $B_0$ and $B_1$ inhomogeneities, but require the introduction of additional inversion pulses that result in a significant signal-to-noise ratio ("SNR") loss, and has a tremendous impact on sequence efficiency, typically requiring an inversion time of 160-200 milliseconds every repetition time.

Methods for correcting macroscopic field inhomogeneities typically focus on the through-slice field variation, and often assume locally linear variations. These methods can be classified into two general categories: those that modify the acquisition to minimize field variation effects in the data, and those that correct the data by postprocessing.

Methods based on acquisitions modified to minimize field variation effects in the acquired data typically use several images obtained with higher resolution along the largest direction, which are subsequently magnitude-combined in order to prevent dephasing for increasing echo times. In one such method, two acquisitions are performed with different "mis-adjustments" of the refocusing part of the slice selection gradient. These images are subsequently combined in order to mitigate the dephasing due to macroscopic field variation. In another such method, a technique termed multi-gradient echo with magnetic susceptibility inhomogeneity compensation ("MGESIC") is developed, where the slice refocusing gradient is varied between even and odd echoes. This method allows for faster acquisition with a single echo train. In yet another such method, a multiple-gradient-echo sequence is provided for mitigating the effects of background field gradients along the slice direction. This method is based on combining three successive gradient-echo images acquired with different slice refocusing gradients.

Methods based on correcting for macroscopic field variations by postprocessing are typically based on a multi-slice two-dimensional gradient-echo acquisition with a relatively large number of echoes. In one such method, the effects of the through-slice field gradient, $G_b$, are modeled by introducing an additional decay in the gradient-echo signals given by:

$$\mathrm{sinc}\left(\frac{\gamma G_b TE z_0}{2}\right); \tag{1}$$

where $\gamma$ is a gyromagnetic ratio, TE is an echo time, and $z_0$ is slice thickness. The unknown parameter, $G_z$, is then fitted from the acquired multi-echo magnitude signal in an iterative procedure that alternates between updating the estimates for $G_z$ and those for the signal amplitude, $\rho_W$, and for $R_2^*$. Rather than including the additional decay term in the signal model and fitting the data with the "complete" model, this method removes the additional decay and then fits the standard model to the corrected signal. This approach may be acceptable in the absence of noise, but it will alter the statistics of the noise so that a least-squares fitting is no longer accurate, which will be particularly relevant in cases of iron overload, where signal decays fast and later echoes contain mostly noise. Thus, while this approach shows good correction of background field gradients, it is limited in regions of very rapid, or in-plane, field variations. This approach is also limited because it results in significant noise amplification due to the need to estimate $G_z$ from the magnitude data. Such noise amplification occurs with short data acquisitions like those typically performed for chemical-shift-based methods, such as iterative decomposition of water and fat with echo asymmetry and least-squares estimation ("IDEAL").

In another postprocessing method, a high-resolution three-dimensional scan is used to estimate the $B_0$ field map and to correct a lower resolution two-dimensional multi-slice, multi-echo acquisition. This method allows for accurate modeling of the background field gradients, but requires additional data acquisition.

In yet another postprocessing method, a multi-slice method for $R_2^*$ mapping is used. The method uses long echo trains with "in-phase" echoes. The background field variation is considered in the slice direction only, and is fitted similarly to the method described above, but the value of $G_z$ is initialized from an estimated field map, which is in turn obtained by linearly fitting the unwrapped phase of the acquired signal at each voxel. This method also attempts to remove the additional decay from the signal, and the corrected signal is fitted with a decaying exponential to obtain $R_2^*$. Again, this approach leads to significant distortions in the noise statistics, particularly in points where the value of the additional sinc-based decay term approaches zero. Acquiring only in-phase echoes forces the echoes to be spaced widely, resulting in poor ability to measure $R_2^*$ in the presence of high iron concentrations.

In yet another postprocessing method, a technique is introduced for correcting quadratic, instead of just linear, background field variations in the through-slice direction. The acquisition used is a modified echo-planar imaging ("EPI") sequence without the blipped gradients, with a large number of echoes, and with low spatial resolution. An initial $B_0$ field map is obtained from an additional higher-resolution three-dimensional gradient-echo acquisition, which is repeated twice with different echo times. This initial field map is then used for the fitting to estimate the linear and quadratic coefficients of the $B_0$ field variation.

In light of the foregoing approaches to minimizing the ill effects that fat tissue and macroscopic $B_0$ field variations have on quantification of $R_2^*$ measurements, it would be advantageous to provide a method for $R_2^*$ quantification that accounts for macroscopic $B_0$ field variations-related signal decays, mitigates susceptibility-related errors, requires only a single data acquisition, and mitigates SNR losses. Moreover, it would be advantageous to provide such a method that is independent of the data acquisition parameters and specific MRI system hardware.

SUMMARY OF THE INVENTION

The present invention overcomes the aforementioned drawbacks by providing a method for measuring transverse relaxation rate, $R_2^*$, in a subject with a magnetic resonance imaging ("MRI") system, in which signal decays that occur as a result of macroscopic variations in the main magnetic field of the MRI system are incorporated into a chemical-shift based signal model. Such a model also provides for the mitigation of susceptibility-based errors and allows better signal-to-noise ratio ("SNR") performance compared to previous methods for $R_2^*$ measurement.

It is an aspect of the invention to provide a method for measuring transverse relaxation rate, in which image data are acquired with an MRI system by sampling a plurality of different echo signals occurring at a respective plurality of different echo times. For each of the plurality of different echo signals, a signal model that accounts for relative signal components for each of a plurality of different chemical species is formed or otherwise provided. Magnetic field inhomogeneity values associated with the MRI system are then estimated by fitting the acquired image data to the formed signal models. Then, for each of the plurality of different echo signals, a revised model is formed using the estimated magnetic field inhomogeneity values. The revised signal model accounts for relative signal components for each of the plurality of different chemical species and for signal decay resulting from macroscopic variations in a main magnetic field of the MRI system. Transverse relaxation rate values for at least one of the plurality of different chemical species are then estimated by fitting the acquired image data to the revised signal models.

The foregoing and other aspects and advantages of the invention will appear from the following description. In the description, reference is made to the accompanying drawings, which form a part hereof, and in which there is shown by way of illustration a preferred embodiment of the invention.

Such embodiment does not necessarily represent the full scope of the invention, however, and reference is made therefore to the claims and herein for interpreting the scope of the invention.

DETAILED DESCRIPTION OF THE INVENTION

A method for $R_2$ mapping in the presence of fat and macroscopic field variations is provided. The provided method is based on a chemical shift-encoded data acquisition with short echo spacings, which allows simultaneous water-fat signal separation and $R_2^*$ estimation. Because the data acquisition can also be used to estimate a $B_0$ field map, the $B_0$ field is measured. Using the measured $B_0$ field, the $R_2^*$ estimates are corrected for the effects of macroscopic field variations. This allows the measurement of $R_2^*$ that is independent of the acquisition parameters and, therefore, independent of the MRI scanner hardware. In one embodiment, The signal model for a combined water-fat signal for N echoes acquired at echo times, $t_n$, in which multiple spectral peaks are accounted for in the fat signal, may be expressed as:

$$s_n = (\rho_W + \rho_F c_F) e^{-R_2^* t_n} e^{i2\pi f_B t_n} \quad (2);$$

where $\rho_W$ and $\rho_F$ are the water and fat signal amplitudes, respectively; $t_n$ is the echo time for the $n^{th}$ acquired echo signal, with $n=1, \ldots, N$; $R_2^*$ is the transverse relaxation rate as affected by magnetic field inhomogeneities, which is equal to $R_2^* = 1/T_2^*$; $f_B$ is the local frequency offset (in Hertz) due to $B_0$ field inhomogeneities; and $C_F$, is a fat signal model that includes multiple spectral peaks, as described, for example, by H. Yu, et al., in "Multiecho Water-Fat Separation and Simultaneous R2* Estimation with Multifrequency Fat Spectrum Modeling," *Magnetic Resonance in Medicine*, 2008; 60(5):1122-1134. The frequency offset, $f_B$, due to $B_0$ field inhomogeneities can be expressed as:

$$f_B = \frac{\gamma \Delta B_0}{2\pi}; \quad (3)$$

where $\gamma$ is the gyromagnetic ratio, and $\Delta B_0$ is a variation in the $B_0$ field. The fat signal model, $c_F$, is given by:

$$c_F = \sum_{m=1}^{M} \alpha_m e^{i2\pi f_m t_n}; \quad (4)$$

where $f_m$ is the $m^{th}$ frequency value for the M spectral peaks in the fat signal model, and $\alpha_m$ is the $m^{th}$ relative spectral peak amplitude value for the M spectral peaks in the fat signal model. The spectral frequencies, $f_m$, of the fat signal are known, as are the relative peak amplitudes, $\alpha_m$, for those spectral peaks. If the relative peak amplitudes, $\alpha_m$, are not know, they can be determined using an auto-calibration technique, such as the one described in U.S. Pat. No. 7,924,003, which is herein incorporated by reference in its entirety. The relative peak amplitudes, $\alpha_m$, are subject to the following relationship:

$$\sum_{m=1}^{M} |\alpha_m| = 1. \quad (5)$$

The signal model in Eqn. (2) may be modified to account for additional signal decay, $h(t_n)$, arising from macroscopic variations in the main magnetic field, $B_0$, within each voxel location as:

$$s_n = (\rho_W + \rho_F c_F) e^{-R_2^* t_n} e^{i2\pi f_B t_n} h(t_n) \quad (6).$$

The signal decay, $h(t_n)$, resulting from macroscopic variations in the $B_0$ field is given by:

$$h(t_n) = \int SRF(r) e^{i2\pi g_B \cdot r} dr \quad (7);$$

where SRF(r) is the spatial response function, $g_B$ is a linear variation in the main magnetic field, $B_0$, over the voxel. The spatial response function, SRF(r), can be approximated by a rect( . . . ) function in the slice-encoding direction for two-dimensional acquisitions; therefore, in these instances, the through-slice decay is predominantly a sinc( . . . ) function. For three-dimensional acquisitions, the spatial response function, SRF(r), can be approximated by a sinc( . . . ) function. In these three-dimensional acquisitions, the signal decay can be approximated numerically by integrating over the main lobe of the sinc( . . . ) function. In general, the spatial response function can be modified to reflect the profile of the voxel in general.

The additional signal decay, $h(t_n)$, is generally non-exponential and is an additional confounding factor that has been previously unaccounted for when measuring $R_2^*$. Typically, the effects of the $h(t_n)$ signal decay result in an overestimation of $R_2^*$.

Frequently in MR acquisitions, the spatial resolution is significantly coarser along one dimension, such as the through-slice direction, compared with the remaining two, in-plane, dimensions. In this case, the signal model in Eqn. (6) can be simplified as:

$$s_n = \int (\rho_W + \rho_F c_F) e^{-R_2^* t_n} e^{i2\pi f_B t_n} SRF(z - z_0) dz \quad (8);$$

where z is the through-plane direction, and $z_0$ is the center of a voxel in the z-direction. For two-dimensional acquisitions with an ideal slice profile, negligible in-plane field variation, and linear through-plane field variation, $$\Delta B_0 = \Delta B_0(z_0) + G(z - z_0) \quad (9);$$

and, thus, Eqn. (8) may be expressed as:

$$s_n = \int (\rho_W + \rho_F c_F) e^{-R_2^* t_n} e^{i2\pi\left(\frac{\gamma(\Delta B_0(z_0) + G(z - z_0))}{2\pi}\right) t_n} SP(z - z_0) dz; \quad (10)$$

which can be approximated as:

$$s_n \approx (\rho_W + \rho_F c_F) e^{-R_2^* t_n} e^{i2\pi f_B(z_0) t_n} \operatorname{sinc}\left(\frac{\gamma G \Delta z t_n}{2\pi}\right); \quad (11)$$

where $SP(z-z_0)$ is the slice profile for a voxel centered at $z_0$, $f_B(z_0) = (\gamma \Delta B_0(z_0)/2\pi)$, and $\Delta z = z - z_0$ is the slice thickness.

The signal model in Eqn. (11) shows that, in the presence of macroscopic $B_0$ field variations, the signal decay is further modulated by a sinc function, which introduces faster additional signal decay for larger $B_0$ field gradients. In such an instance, it may be beneficial to assume that water, fat, and $R_2^*$ are uniform across the slice thickness, which, in general, is a good approximation when the image slices are thin.

For two-dimensional acquisitions, knowledge of the gradient, G, can be included in the signal model to correct for background field variations that results in errors in $R_2^*$ estimation. Also, it is noted that with the signal model in Eqn. (10), non-uniform slice profiles can be accounted for. In general, such non-uniform slice profiles will not result in sinc modulation of the acquired signal, but given the slice profile the signal modulation can be derived using, for example, numerical integration.

In order to solve for the unknown parameters ($\rho_W, \rho_F, \Delta B_0, R_2^*$) in the signal models presented in Eqns. (6), (8), (10), or (11), the signal models can be discretized. Without a loss of generality, an example of discretizing Eqn. (8) for the three-dimensional case in terms of spatial basis functions is given by:

$$s_n = \int A \cdot B \cdot SRF(z - z_0) dz \quad (12);$$

where:

$$A = \sum_q \psi(z - q\Delta z)(\rho_W(q\Delta z) + \rho_F(q\Delta z) c_F(t_n)); \quad (13)$$

and:

$$B = e^{\sum_u \psi(z - u\Delta z)(i2\pi f_B(u\Delta z) - R_2^*(u\Delta z)) t_n}. \quad (14)$$

In Eqns. (13) and (14), $\psi(z)$ are basis functions, such as triangular basis functions. The spatial response function, SRF(z), may be approximated by its main lobe, or by one or more modes in the function. Note that in Eqns. (12)-(14), the only unknowns are $\rho_W, \rho_F, f_B,$ and $R_2^*$ at a discrete set of locations. Therefore, the estimation problem can be posed as a least-squares fitting, where the parameters that best fit the acquired data according to Eqns. (12)-(14) is sought. This optimization problem can be solved iteratively using, for example, a gradient-based descent algorithm. Note that, even though the problem is non-convex and will generally contain multiple local minimizers, a good initial guess is typically available from a first fitting using standard $R_2^*$-corrected fat-water reconstruction algorithms.

Figure 1:
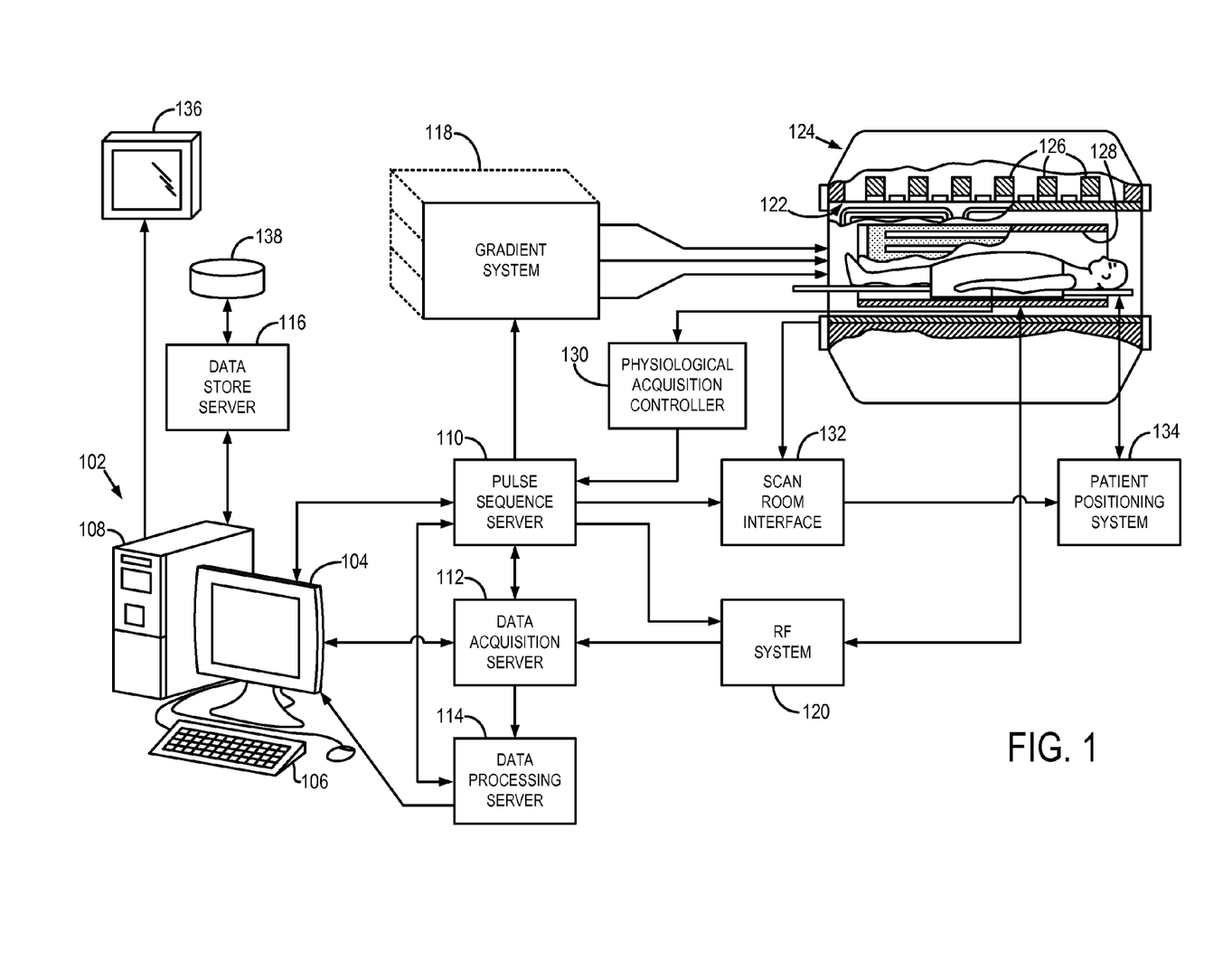
FIG. 1 is a block diagram of an exemplary magnetic resonance imaging ("MRI") system that employs the present invention.

Referring particularly now to FIG. 1, an exemplary MRI system 100 for use when practicing embodiments of the provided method is illustrated. The MRI system 100 includes a workstation 102 having a display 104 and a keyboard 106. The workstation 102 includes a processor 108, such as a commercially available programmable machine running a commercially available operating system. The workstation 102 provides the operator interface that enables scan prescriptions to be entered into the MRI system 100. The workstation 102 is coupled to four servers: a pulse sequence server 110; a data acquisition server 112; a data processing server 114, and a data store server 116. The workstation 102 and each server 110, 112, 114 and 116 are connected to communicate with each other.

The pulse sequence server 110 functions in response to instructions downloaded from the workstation 102 to operate a gradient system 118 and a radiofrequency ("RF") system 120. Gradient waveforms necessary to perform the prescribed scan are produced and applied to the gradient system 118, which excites gradient coils in an assembly 122 to produce the magnetic field gradients $G_x$, $G_y$, and $G_z$ used for position encoding MR signals. The gradient coil assembly 122 forms part of a magnet assembly 124 that includes a polarizing magnet 126 and a whole-body RF coil 128.

RF excitation waveforms are applied to the RF coil 128, or a separate local coil (not shown in FIG. 1), by the RF system 120 to perform the prescribed magnetic resonance pulse sequence. Responsive MR signals detected by the RF coil 128, or a separate local coil (not shown in FIG. 1), are received by the RF system 120, amplified, demodulated, filtered, and digitized under direction of commands produced by the pulse sequence server 110. The RF system 120 includes an RF transmitter for producing a wide variety of RF pulses used in MR pulse sequences. The RF transmitter is responsive to the scan prescription and direction from the pulse sequence server 110 to produce RF pulses of the desired frequency, phase, and pulse amplitude waveform. The generated RF pulses may be applied to the whole body RF coil 128 or to one or more local coils or coil arrays (not shown in FIG. 1).

The RF system 120 also includes one or more RF receiver channels. Each RF receiver channel includes an RF amplifier that amplifies the MR signal received by the coil 128 to which it is connected, and a detector that detects and digitizes the I and Q quadrature components of the received MR signal. The magnitude of the received MR signal may thus be determined at any sampled point by the square root of the sum of the squares of the I and Q components:

$$M=\sqrt{I^2+Q^2} \tag{15};$$

and the phase of the received MR signal may also be determined:

$$\varphi = \tan^{-1}\left(\frac{Q}{I}\right). \tag{16}$$

The pulse sequence server 110 also optionally receives patient data from a physiological acquisition controller 130. The controller 130 receives signals from a number of different sensors connected to the patient, such as electrocardiograph ("ECG") signals from electrodes, or respiratory signals from a bellows or other respiratory monitoring device. Such signals are typically used by the pulse sequence server 110 to synchronize, or "gate," the performance of the scan with the subject's heart beat or respiration.

The pulse sequence server 110 also connects to a scan room interface circuit 132 that receives signals from various sensors associated with the condition of the patient and the magnet system. It is also through the scan room interface circuit 132 that a patient positioning system 134 receives commands to move the patient to desired positions during the scan.

The digitized MR signal samples produced by the RF system 120 are received by the data acquisition server 112. The data acquisition server 112 operates in response to instructions downloaded from the workstation 102 to receive the real-time MR data and provide buffer storage, such that no data is lost by data overrun. In some scans, the data acquisition server 112 does little more than pass the acquired MR data to the data processor server 114. However, in scans that require information derived from acquired MR data to control the further performance of the scan, the data acquisition server 112 is programmed to produce such information and convey it to the pulse sequence server 110. For example, during prescans, MR data is acquired and used to calibrate the pulse sequence performed by the pulse sequence server 110.

The data processing server 114 receives MR data from the data acquisition server 112 and processes it in accordance with instructions downloaded from the workstation 102. Such processing may include, for example: Fourier transformation of raw k-space MR data to produce two or three-dimensional images; the application of filters to a reconstructed image; the performance of a backprojection image reconstruction of acquired MR data; the generation of functional MR images; and the calculation of motion or flow images.

Images reconstructed by the data processing server 114 are conveyed back to the workstation 102 where they are stored. Real-time images are stored in a data base memory cache (not shown in FIG. 1), from which they may be output to operator display 112 or a display 136 that is located near the magnet assembly 124 for use by attending physicians. Batch mode images or selected real time images are stored in a host database on disc storage 138. When such images have been reconstructed and transferred to storage, the data processing server 114 notifies the data store server 116 on the workstation 102. The workstation 102 may be used by an operator to archive the images, produce films, or send the images via a network to other facilities.

Figure 2:
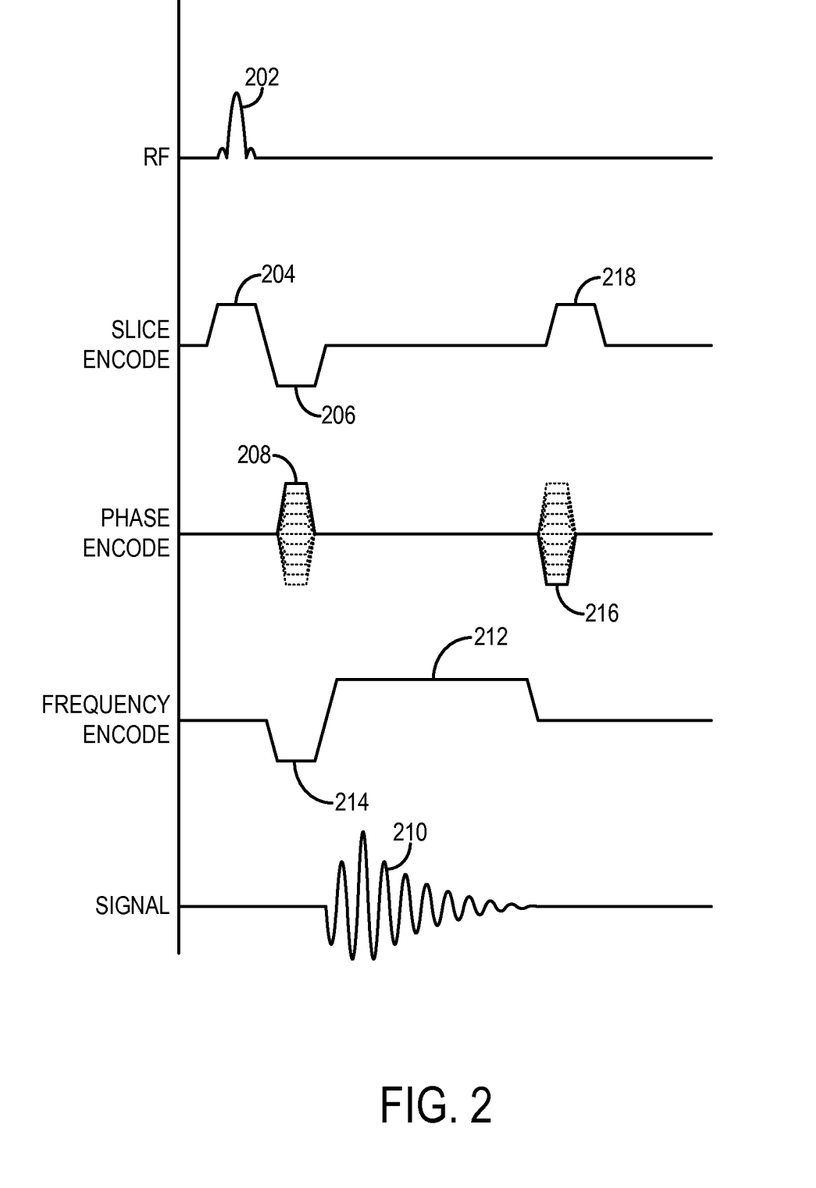
FIG. 2 is a graphic representation of an exemplary spoiled gradient recalled echo ("SPGR") pulse sequence for directing the MRI system of FIG. 1 to acquire image data in accordance with embodiments of the present invention.

An exemplary pulse sequence employed to direct the MRI system to acquire image data in accordance with embodiments the present invention is illustrated in FIG. 2. Such an exemplary pulse sequence is commonly referred to as a spoiled gradient recalled echo ("SPGR") pulse sequence. It will be appreciated, however, that a variety of different pulse sequences can be employed, including fast spin echo ("FSE") sequences, gradient-recalled echo ("GRE") sequences, steady-state free precession ("SSFP") sequences, echo-planar imaging ("EPI") sequences, spiral imaging sequences, and radial imaging sequences.

The exemplary SPGR pulse sequence includes a spatially selective radio frequency ("RF") excitation pulse 202 that is repeated at the start of each repetition time ("TR") period. Moreover, the RF excitation pulse 202 is played out in the presence of a slice-selective gradient 204 in order to produce transverse magnetization in a prescribed imaging slice. The slice-selective gradient 204 includes a rephasing lobe 206 that acts to rephase unwanted phase accruals caused by the RF excitation pulse 202. Following excitation of the nuclear spins in the prescribed imaging slice, a phase encoding gradient 208 is applied to spatially encode a nuclear magnetic resonance signal, representative of a gradient-recalled echo 210, along one direction in the prescribed imaging slice. A readout gradient 212 is also applied after a dephasing gradient lobe 214 to spatially encode the signal representative of echo 210 along a second, orthogonal direction in the prescribed imaging slice. The signal representative of echo 210 is sampled during a data acquisition window.

A rewinder gradient 216 is played out along the phase-select gradient axis in order to rephase remaining transverse magnetization in preparation for subsequent repetitions of the pulse sequence. As is well known in the art, the pulse sequence is repeated and the amplitude of the phase-encoding gradient 206 and the rewinder gradient 216, which is equal in amplitude and area, but opposite in polarity with respect to the phase-encoding gradient 206, are stepped through a set of values such that k-space is sampled in a prescribed manner. The pulse sequence concludes with the application of a spoiler gradient 218 that spoils the remaining transverse magnetization.

As will be explained in more detail below, image data is acquired a plurality of times from each prescribed imaging slice, and the echo time ("TE") is incremented during successive repetitions such that N sets of image data corresponding to N different echo times are acquired for each prescribed imaging slice. Alternatively, the N sets of image data can be acquired at N different echo times within the same TR period. Furthermore, the N sets of image data can be acquired at multiple TRs, each collecting a subset of image data. By way of example, the successive echo times are incremented by 1.6 milliseconds during each successive repetition of the pulse sequence. It is noted that any number of multiple echoes can be acquired when practicing the present invention, including only two echoes, in which so-called "2-point Dixon methods" can be employed. In general the more echoes that are acquired, the more reliable the method will be, although, with the tradeoff of increased scan time. For example, as the number of echoes acquired is increased, the spectral differences between species become more "observable." Additional echoes may be acquired with low spatial resolution in order to minimize additional scan time requirements.

The pulse sequence employed to direct the MRI system to acquire data can be adapted to include magnetization preparation pulses in order to manipulate the spectra of the species being imaged. For example, non-selective or spectrally selective magnetization preparation pulses can be utilized, such as inversion recovery pulses, $T_2$-prep pulses, fat-sat pulses, and magnetization transfer pulses. SSFP pulse sequences can also be implemented to alter the characteristics of specific spectral peaks. In this manner, a particular spectrum can be made more "unique" and easier to separate. For example, if different peaks of fat are placed in different spectral pass bands of an SSFP-based acquisition, the change in phase between pass bands will alter the sign, positive or negative, of specific spectral peaks. This behavior can be exploited to improve the robustness of the separation. Other preparation methods include $T_2$-prep methods; magnetization transfer methods; methods that facilitate J-coupling; methods that exploit differences in $T_1$ or $T_2$ between species, or between peaks within a specific species; velocity encoding; and any such methods that change the appearance of the spectrum of a particular species.

Figure 3:
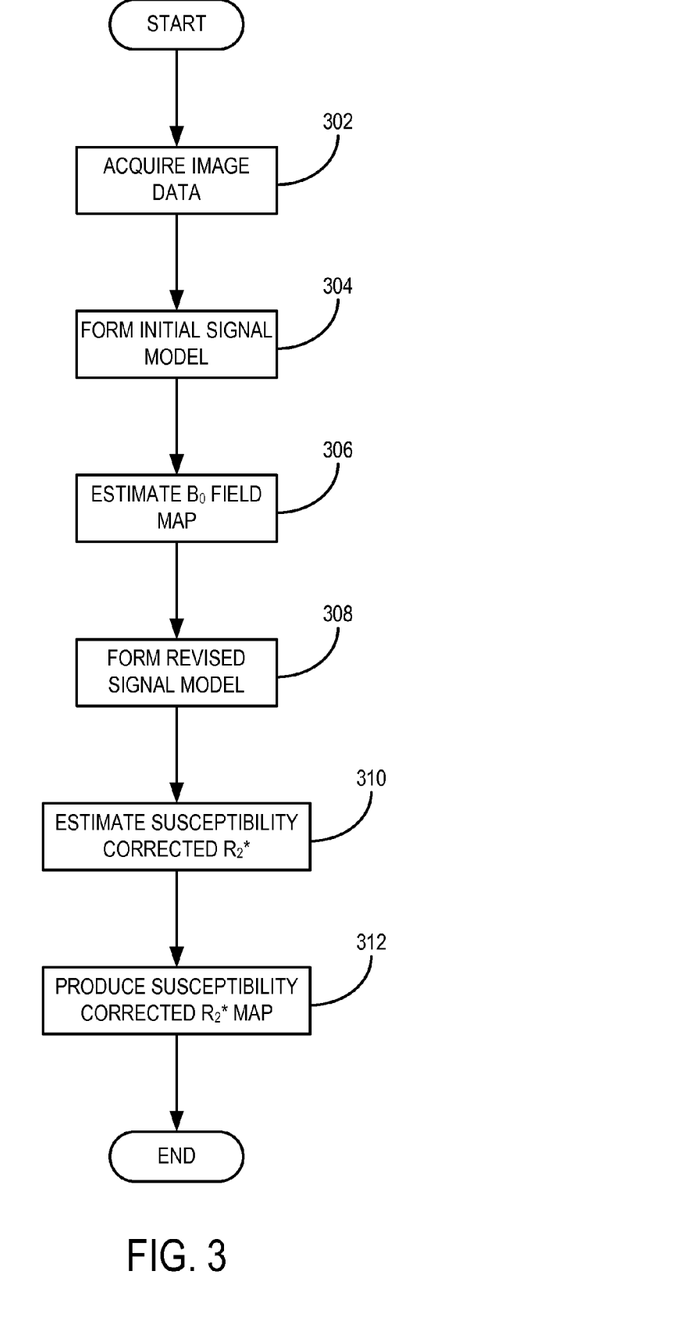
FIG. 3 is a flowchart setting forth the steps of an exemplary method for measuring $R_2^*$ and producing an $R_2^*$ map, in accordance with embodiments of the invention.

Referring now to FIG. 3, an flowchart setting forth the steps of an exemplary method for quantitatively measuring $R_2^*$ using an MRI system is illustrated. As indicated at step 302, the method begins with the acquisition of image data using, for example, the pulse sequence described above with respect to FIG. 2. An initial signal model is formed, as indicated at step 304. For example, the signal model in Eqn. (2) is formed. The acquired image data is fitted to the initial model in order to provide an estimate of the $B_0$ field map, as indicated at step 306. This field map estimate is then employed to form a revised signal model, as indicated at step 308. This revised signal model includes a term that accounts for additional signal decay resulting from macroscopic variations in the $B_0$ field. For example, the signal model in one of Eqns. (6), (8), (10), and (11) is formed. The image data acquired in step 302 is then fitted to this revised signal model in order to provide an estimate of $R_2^*$ that has been corrected for susceptibility effects resulting from macroscopic variations in the $B_0$ field, as indicated at step 310. The estimated $R_2^*$ values are then used to produce a susceptibility corrected $R_2^*$ map, as indicated at step 312. For example, the $R_2^*$ value for each pixel location, as determined from step 310, is assigned to a corresponding pixel location in an image matrix of the $R_2^*$ map.

A method for $R_2^*$ mapping in the presence of fat and macroscopic field variations has been provided. This method allows robust $R_2^*$ mapping for a wide range of acquisition parameters, specifically echo time combination and slice thickness. SNR loss due to including fat signals in the model is negligible for low to moderate $R_2^*$ values, especially as compared to currently available methods. For very large $R_2^*$ values, the SNR loss is non-negligible, but in that regime it is also very problematic to sample with in-phase echo spacing because substantially all the signal will have decayed by the second echo. The provided method is applicable to the calculation of $R_2^*$ in the presence of chemical species other than fat or water alone. For example, the signal models presented herein can account for water, fat, silicone, hyperpolarized carbon-13, metabolites containing hyperpolarized carbon-13, hyperpolarized xenon-129, hyperpolarized helium-3, acetone, choline, lactate, and, generally, any system of distinct chemical species with different resonance frequencies. Moreover, the method is applicable to simultaneously and independently estimate $R_2^*$ for more than one chemical species. For instance, the $R_2^*$ values for both water and fat can be jointly and independently estimated using the provided method.

The provided method uses a locally linear model for $B_0$ field variations. In regions of very severe susceptibility-induced field variations, with significant higher order terms in the $B_0$ field variation, it is contemplated that it will be advantageous to acquire thinner slices, which will result in reduced susceptibility effects and allow better approximation by a locally linear $B_0$.

The present invention has been described in terms of one or more preferred embodiments, and it should be appreciated that many equivalents, alternatives, variations, and modifications, aside from those expressly stated, are possible and within the scope of the invention.

We claim:

1. A method for measuring a transverse magnetization relaxation rate that is corrected for macroscopic magnetic field inhomogeneities in a subject with a magnetic resonance imaging (MRI) system, the steps of the method comprising:
   a) acquiring image data with the MRI system by sampling a plurality of different echo signals occurring at a respective plurality of different echo times;
   b) forming a plurality of initial signal models by forming for each of the plurality of different echo signals, an initial signal model that accounts for relative signal components for each of a plurality of different chemical species;
   c) estimating magnetic field inhomogeneity values associated with the MRI system by fitting the image data acquired in step a) to the initial signal models formed in step b);
   d) forming a plurality of revised signal models by forming for each of the plurality of different echo signals using the magnetic field inhomogeneity values estimated in step c), a revised signal model that accounts for relative signal components for each of a plurality of different chemical species and for signal decay resulting from macroscopic variations in a main magnetic field of the MRI system, the macroscopic variations in the main magnetic field of the MRI system being different from the magnetic field inhomogeneity values estimated in step c); and
   e) estimating a transverse relaxation rate for at least one of the plurality of different chemical species by fitting the image data acquired in step a) to the revised signal models formed in step d).

2. The method as recited in claim 1 in which forming the revised signal models in step d) includes calculating a spatial response function using the magnetic field inhomogeneity values estimated in step c).

3. The method as recited in claim 2 in which the spatial response function models the signal decay resulting from macroscopic variations in the main magnetic field of the MRI system as a sinc modulation.

4. The method as recited in claim 2 in which calculating the spatial response function in step c) includes calculating a variation in the magnetic field inhomogeneity values estimated in step c).

5. The method as recited in claim 4 in which the variation in the magnetic field inhomogeneity values is calculated in step c) by calculating a gradient of the magnetic field inhomogeneity values estimated in step c).

6. The method as recited in claim 1 in which the plurality of different chemical species includes at least two of water, fat, silicone, hyperpolarized carbon-13, metabolites containing hyperpolarized carbon-13, hyperpolarized xenon-129, hyperpolarized helium-3, acetone, choline, and lactate.

7. The method as recited in claim 1 in which the plurality of different chemical species comprises water and fat, and in which the initial signal models formed in step b) account for a fat spectrum having multiple spectral peaks.

8. The method as recited in claim 7 in which the transverse magnetization relaxation rate estimated in step e) is a transverse relaxation rate of water.

9. The method as recited in claim 7 in which step d) includes simultaneously estimating a transverse magnetization relaxation rate for water and a transverse magnetization relaxation rate for fat.

10. The method as recited in claim 1 further comprising:
 f) producing an $R_2^*$ map that is corrected for susceptibility effects using the transverse magnetization relaxation rate estimated in step e).

11. The method as recited in claim 1 in which the magnetic field inhomogeneity values estimated in step c) are indicative of magnetic field inhomogeneities along less than three spatial directions.

12. The method as recited in claim 11 in which the magnetic field inhomogeneity values estimated in step c) are indicative of a magnetic field inhomogeneities along only a direction transverse to an image slice.

13. The method as recited in claim 1 in which the revised signal modles formed in step d) account for both signal decay resulting from macroscopic variations in a main magnetic field of the MRI system and the magnetic field inhomogeneity values estimated in step c) using the initial signal models that were formed in step b).

14. The method as recited in claim 1 in which the revised signal models formed in step d) model the signal decay resulting from macroscopic variations in a main magnetic field of the MRI system using a non-exponential decay term.

* * * * *